(12) United States Patent
Lee et al.

(10) Patent No.: US 9,222,644 B2
(45) Date of Patent: Dec. 29, 2015

(54) OPTICAL ASSEMBLY, BACKLIGHT UNIT HAVING THE SAME, AND DISPLAY APPARATUS THEREOF

(71) Applicant: LG ELECTRONICS INC., Seoul (KR)

(72) Inventors: Kyungjoon Lee, Seoul (KR); Woongjoon Hwang, Seoul (KR); Juyoung Joung, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/603,516

(22) Filed: Jan. 23, 2015

(65) Prior Publication Data

US 2015/0300594 A1 Oct. 22, 2015

Related U.S. Application Data

(63) Continuation of application No. 13/557,534, filed on Jul. 25, 2012, now abandoned.

(60) Provisional application No. 61/545,590, filed on Oct. 11, 2011.

(30) Foreign Application Priority Data

Dec. 2, 2011 (KR) .......... 10-2011-0128049

(51) Int. Cl.
*G09F 13/04* (2006.01)
*G09F 13/08* (2006.01)
(Continued)

(52) U.S. Cl.
CPC .............. *F21V 5/04* (2013.01); *G02B 19/0028* (2013.01); *G02B 19/0047* (2013.01)

(58) Field of Classification Search
CPC ........... F21V 5/004; F21V 5/04; F21V 5/046; F21V 5/048; F21V 7/0091; F21V 13/04; G02B 6/0073; G02B 9/0028; G02B 9/0047; G02B 9/0061; G02B 9/0066; G02B 9/00713; G02F 1/133603; H01L 33/58
USPC .......................................... 362/97.3
See application file for complete search history.

(56) References Cited

U.S. PATENT DOCUMENTS 6,582,103 B1 6/2003 Popovich et al.
7,566,148 B2 7/2009 Noh et al. ............ 362/305
(Continued)

FOREIGN PATENT DOCUMENTS

CN 1904650 A 1/2007
CN 101111793 A 1/2008
(Continued)

OTHER PUBLICATIONS

International Search Report issued in Application No. PCT/KR2012/005888 dated Jan. 29, 2013.
(Continued)

*Primary Examiner* — Jason Moon Han
(74) *Attorney, Agent, or Firm* — Ked & Associates, LLP

(57) ABSTRACT

The present invention provides an optical assembly, a backlight unit having the same, and a display apparatus thereof, and the optical assembly includes: a light emitting device; and a lens disposed above the light emitting device, and the lens has: a lower surface portion through which light emitted from the light emitting device travels inside; an upper surface portion that totally reflects at least some of the light traveling inside through the lower surface portion, downward to the side; and a side portion through which the light totally reflected from the upper surface portion is discharged to the outside.

14 Claims, 32 Drawing Sheets

(51) Int. Cl.
  *F21V 5/04*   (2006.01)
  *G02B 19/00*  (2006.01)

(56) References Cited

U.S. PATENT DOCUMENTS

| | | | |
|---|---|---|---|
| 7,808,581 B2 | 10/2010 | Panagotacos et al. | 349/69 |
| 2005/0001537 A1 | 1/2005 | West et al. | |
| 2007/0024990 A1 | 2/2007 | Paek et al. | |
| 2008/0074886 A1 | 3/2008 | Chang | |
| 2011/0222294 A1 | 9/2011 | Fan et al. | 362/296.01 |
| 2012/0081907 A1 | 4/2012 | Kato et al. | |

FOREIGN PATENT DOCUMENTS

| | | |
|---|---|---|
| CN | 101358712 A | 2/2009 |
| CN | 101515068 A | 8/2009 |
| CN | 101883994 A | 11/2010 |
| JP | 2009-21221 A | 1/2009 |
| KR | 10-2007-0013469 | 1/2007 |
| KR | 10-2008-0038669 | 5/2008 |
| KR | 10-2008-0056784 | 6/2008 |
| KR | 10-0902908 | 6/2009 |
| WO | WO 2010/113575 A1 | 10/2010 |

OTHER PUBLICATIONS

U.S. Office Action issued in co-pending U.S. Appl. No. 13/557,534 dated May 15, 2014.

U.S. Office Action issued in co-pending U.S. Appl. No. 13/557,534 dated Aug. 25, 2014.

European Search Report issued in Application No. 12840773.1 dated Jun. 26, 2015.

Chinese Office Action issued in Application No. 201280050106.1 dated Oct. 9, 2015.

(a) (b) (c)

FIG. 21
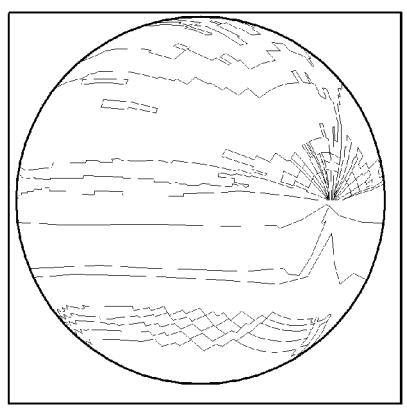
(a)
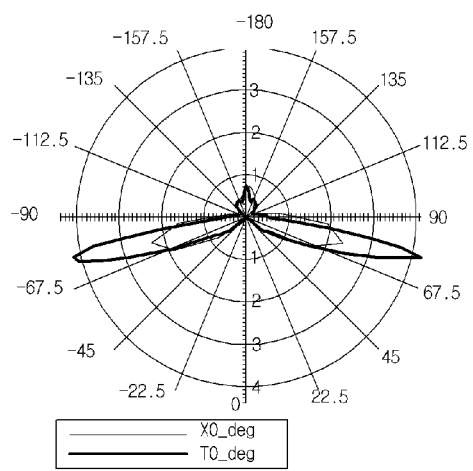
(b)

OPTICAL ASSEMBLY, BACKLIGHT UNIT HAVING THE SAME, AND DISPLAY APPARATUS THEREOF

CROSS-REFERENCE TO RELATED APPLICATION(S)

This application is a Continuation of U.S. patent application Ser. No. 13/557,534 which claims priority under 35 U.S.C. §119 and §120 to U.S. Provisional Patent Application No. 61/545,590 filed on Oct. 11, 2011 and Korean Patent Application No. 10-2011-0128049 filed on Dec. 2, 2011, whose entire disclosures are hereby incorporated by reference.

BACKGROUND

The present invention relates to an optical assembly, a backlight unit having the same, and a display apparatus thereof.

As the information society is developed, demands for display apparatuses are increasing in various ways, and for meeting the demands, various display apparatuses such as an LCD (Liquid Crystal Display Device), a PDP (Plasma Display Panel), an ELD (Electro Luminescent Display), and a VFD (Vacuum Fluorescent Display) have been studied and used.

The liquid crystal panel of an LCD in the apparatuses includes a liquid crystal layer, TFT substrates opposite each other with the liquid crystal layer therebetween, and a color filter substrate, and can display an image, using light provided from a backlight unit, because the LCD has no self-light emission ability.

SUMMARY

The present invention has been made in an effort to provide an optical assembly that can improve the quality of a display image.

Further, the present invention has been made in an effort to provide a backlight unit using the optical assembly and a display apparatus thereof.

An exemplary embodiment of the present invention provides a backlight that includes a plurality of light sources, in which the light source includes: a light emitting device; and a lens disposed above the light emitting device, and the lens has: a lower surface portion through which light emitted from the light emitting device travels inside; an upper surface portion that totally reflects at least some of the light traveling inside through the lower surface portion, downward to the side; and a side portion through which the light totally reflected from the upper surface portion is discharged to the outside.

Another exemplary embodiment of the present invention provides a display apparatus including: a backlight unit including a plurality of light sources; and a display panel disposed on the backlight unit, in which at least one of the plurality of light sources of the backlight unit includes: a light emitting device; and a lens disposed above the light emitting device, and the lens has: a lower surface portion through which light emitted from the light emitting device travels inside; an upper surface portion that totally reflects at least some of the light traveling inside through the lower surface portion, downward to the side; and a side portion through which the light totally reflected from the upper surface portion is discharged to the outside.

Another exemplary embodiment of the present invention provides an optical assembly including: a light emitting device; and a lens disposed above the light emitting device, and the lens has: a lower surface portion through which light emitted from the light emitting device travels inside; an upper surface portion that totally reflects at least some of the light traveling inside through the lower surface portion, downward to the side; and a side portion through which the light totally reflected from the upper surface portion is discharged to the outside.

BRIEF DESCRIPTION OF THE DRAWINGS

FIG. 21 is a view showing light emission distribution of a lens having the shape according to an exemplary embodiment of the present invention.

DETAILED DESCRIPTION OF THE EMBODIMENTS

Figure 1:
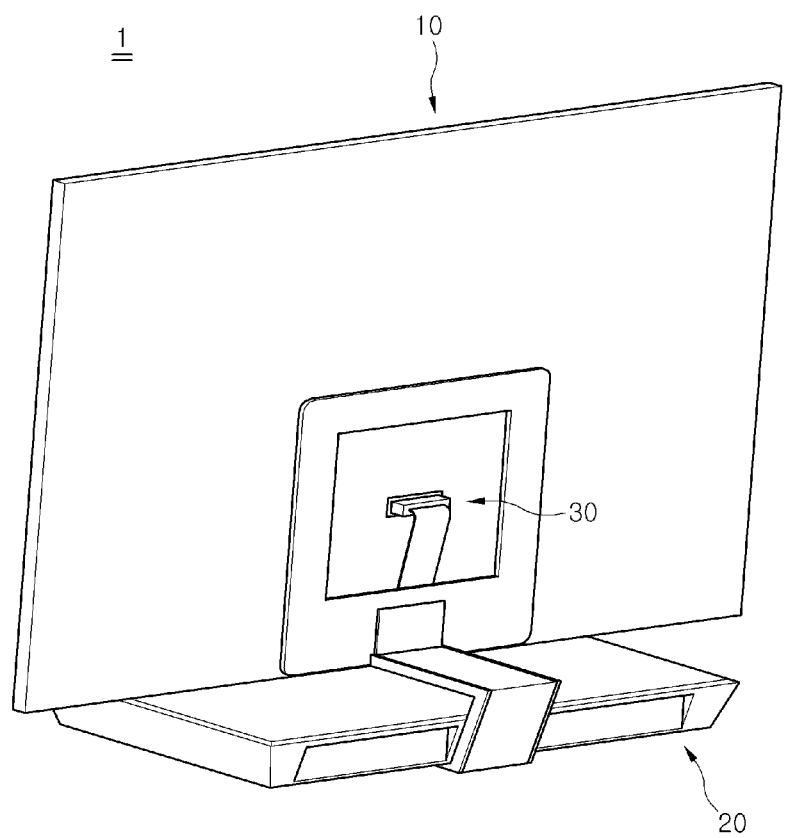
FIG. 1 is a rear perspective view of a display apparatus.

Hereinafter, exemplary embodiments of the present invention will be described with reference to the accompanying drawings. The following exemplary embodiments may be modified in other ways and the scope of the exemplary embodiments is not limited to the exemplary embodiments described below. The exemplary embodiments are provided to more completely explain the present invention to those skilled in the art. Therefore, the shapes and sizes of the components in the drawings may be exaggerated for more clear explanation.

FIG. 1 is a rear perspective view showing an exemplary embodiment of the configuration of a display apparatus.

Referring to FIG. 1, a display apparatus 1 may includes a display unit 10 where an image is displayed, a control module 20 disposed outside the display unit 10, supporting the display unit 10 against the floor, and generating power and an image signal for operation of the display unit 10, and a display apparatus cable 30 transmitting the power and image signal generated by the control module 20 to the display unit 10.

In this configuration, the control module 20 may include a power supply unit (not shown) receiving power from the outside and converting the power into driving power for driving the display unit 10 and a main control unit (not shown) generating an image signal for driving the display unit 10. Further, the control module 20 is configured separately from the display unit 10 and can support the display unit 10 against the floor.

For example, the display unit 10 according to an exemplary embodiment of the present invention is not provided with an individual power supply unit or an individual main control unit for processing an image signal, but includes a display module that displays an image and a protective member that fixes and protects the display module, so that the thickness of the display unit 10 can be reduced.

Figure 2:
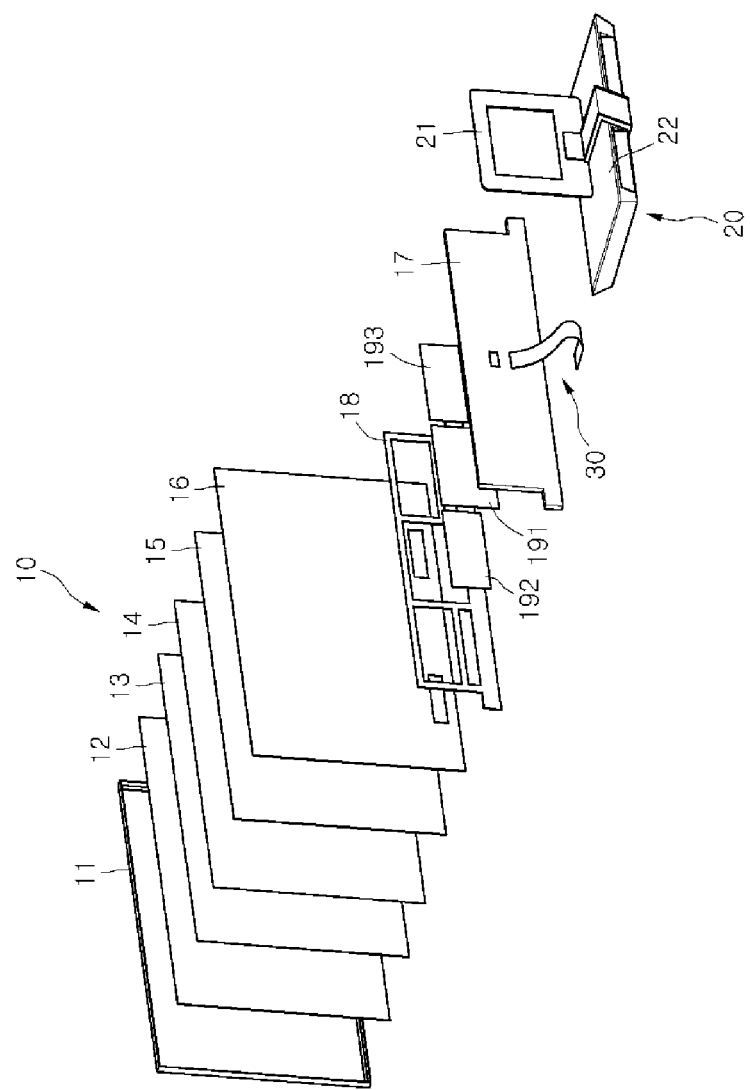
FIG. 2 is an exploded perspective view showing an exemplary embodiment of the configuration of the display apparatus.

FIG. 2 is an exploded perspective view showing an exemplary embodiment of the configuration of the display apparatus.

Referring to FIG. 2, the display unit 10 may include a display panel 12 where an image is displayed and a backlight unit 15 disposed behind the display panel 12 and providing a light source for the display panel 12.

Further, the display unit 10 may include a front frame covering the front edge of the display panel 12 and a plurality of optical sheets 13 and 14, for example, a diffusion sheet 13 and a prism sheet 14, disposed between the backlight unit 15 and the display panel 12 and diffusing or processing light emitted toward the display panel 12 from the backlight unit 15.

Meanwhile, the display unit 10 may include a first back cover 16 covering the rear side of the backlight unit 15 and forming the rear external shape of the display unit 10 and sub-control units 191, 192, and 193 fixed to the rear lower side of the first back cover 16 and driving the display unit 10 by using the supplied power and the image signal received from the control module 20. In this configuration, a control unit frame 18 provides fixing positions of the sub-control units 191, 192, and 193 and the sub-control units 191, 192, and 193 may be covered with a second back cover 17 fixed to the rear side of the first back cover 16.

The display panel 12, the optical sheets 13 and 14, and the backlight unit 15, which are described above, may constitute a display module disposed in the display apparatus 1. In this case, the first back cover 16 is fixed to the rear side of the display module and the front frame 11 may be formed to cover the front edge of the display module. Therefore, the front frame 11 forms the front external shape of the edge that is a non-display area of the display apparatus 1, that is, a bezel area, and the width of the front frame 11 may be the width of the bezel area.

On the other hand, the display panel 12, for example, may include an upper substrate and a lower substrate that are bonded and opposite each other such that a uniform cell gap is maintained, and a liquid crystal layer disposed between the two substrates. A plurality of gate lines and a plurality of data lines crossing the gate lines are formed on the lower substrate and TFTs (thin film transistor) may be formed at the intersections of the gate lines and the data lines.

Further, the backlight unit 15 provides background light for the display panel 12, using a light source that emits light, and as the light source, a cold cathode fluorescent lamp (hereafter, CCFL) or a plurality of light emitting diodes (hereafter, LED) may be included.

When a plurality of LEDs is used as the light source, the backlight unit 15 may be provided in a way in which the direction of light emitted from the LEDs is formed toward the display panel 12 or a way in which the direction of light emitted from the LEDs is formed in parallel with the display panel 12 and the light is refracted such that the light path of the emitted light is formed toward the display panel 12.

In the exemplary embodiment, for example, light is emitted in a way in which the direction of light emitted from the LEDs is formed toward the display panel 12, and the backlight unit 15 may be provided as a film type of substrate having predetermined magnitude of elasticity in which a plurality of LEDs is arranged in an array having a predetermined pattern.

On the other hand, the sub-control units 191, 192, and 193 are provided to control an image displayed on the display panel 12 and the backlight unit 15, and may include a timing controller that receives the image signal inputted from the control unit 20, adjusts the amount of data of the image signal, and drives the display panel 12, and backlight unit-driving units 192 and 193 that drives the backlight unit 15.

In this case, the sub-control units 191, 192, and 193 may be formed to have minimum sizes for receiving the image signal and driving the display panel 12 and the backlight unit 15 and disposed between the first and second back covers 16 and 17.

As described with reference to FIGS. 1 and 2, the configuration of the display apparatus 1 is only an example of the present invention and the present invention is not limited thereto.

Figure 3:
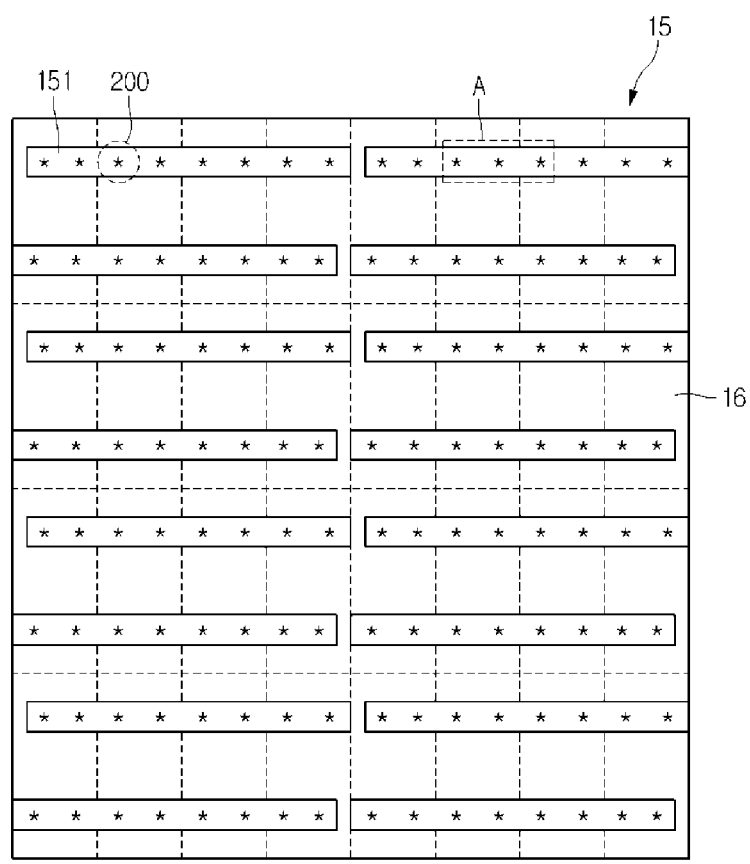
FIG. 3 is a view showing an exemplary embodiment of the configuration of a backlight unit.

FIG. 3 is a view showing an exemplary embodiment of the configuration of the backlight unit and shows the configuration of the backlight unit 15 shown in FIG. 2 in more detail.

Referring to FIG. 3, the backlight unit 15 may be configured by forming a plurality of light sources 200 on a first layer 151 positioned at the upper portion of the back cover 16.

The first layer 151 may be a substrate where the light sources 200 are mounted, in which an adaptor (not shown) that supplies power and an electrode pattern (not shown) that connects the light sources 200 may be formed. For example, a carbon nanotube electrode pattern (not shown) that connects the light sources 200 and the adaptor (not shown) may be formed on the upper surface of the substrate.

Meanwhile, the first layer 151 may be a PCB (Printed Circuit Board) that is made of polyethylene terephthalate, glass, polycarbonate, and silicon and where the light sources 200 are mounted, and may be formed in a film type. The light sources 200 can emit light at a predetermined directional angle around a specific direction and the specific direction may be the direction to which the light emission surfaces of the light sources 200 are arranged.

As an exemplary embodiment of the present invention, the light sources 200 may be implemented by LEDs (Light Emitting Diode) and may include a plurality of LEDs. For example, a light source 13 configured by a light emitting diode can emit light at a directional angle of about 120 degrees around the direction to which the light emission surface is arranged.

In more detail, the LED package constituting the light sources 200 may be divided into a top view type and a side view type in accordance with the direction to which the light emission surface is arranged and the light sources 200 according to an exemplary embodiment of the present invention may be implemented by at least one of a top view type in which the light emission surface is formed to face the upper side and a side view type in which the light emission surface is formed toward a side.

Further, the light sources 200 may be configured by color LEDs that brings out at least one color of colors such as red, blue, and green, or white LEDs. Further, the color LEDs may include at least one of a red LED, a blue LED, and a green LED, and the arrangement of the light emitting diodes and the emitted light may be changed in the scope of the exemplary embodiment.

As shown in FIG. 3, the backlight unit 15 may be driven in a full-driving type and a partial-driving type such as local dimming and impulsive. The driving type of the backlight unit 15 may be changed in various ways in accordance with the circuit design and is not limited thereto. Accordingly, it is possible to increase the color contrast ratio and clearly express images of bright portions and dark portion of a screen, so that the image quality is improved.

That is, the backlight unit is divided and operated in a plurality of divided-driving regions and it is possible to improve contrast ratio and definition by decreasing brightness of a dark portion of an image and increasing brightness of a bright portion by connecting the brightness of the divided-driving region with brightness of an image signal.

For example, it is possible to individually drive only some of the light sources 200 shown in FIG. 3 to emit light upward, and for this operation, the light sources 200 included in the backlight unit 15 may be individually controlled. Meanwhile, the region of the display panel 12 may be divided into two or more blocks, and the display panel 12 and the backlight unit 15 may be separately driven for each block.

Figure 4:
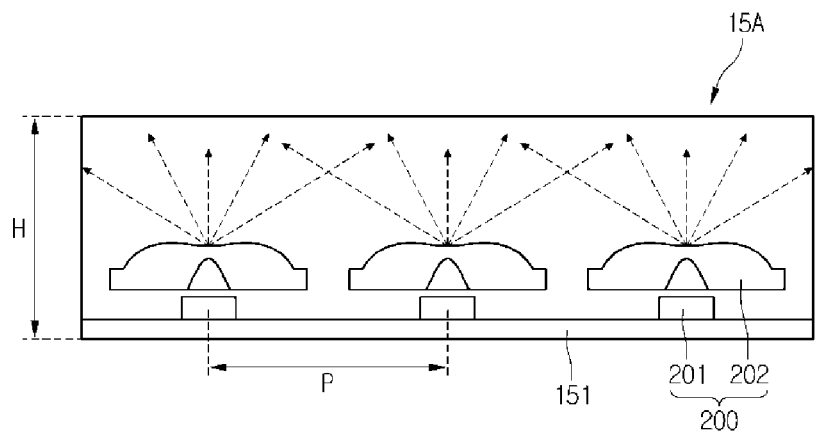
FIG. 4 is a cross-sectional view showing the configuration of the light source shown in FIG. 3.

FIG. 4 is a cross-sectional view showing the configuration of the light sources and shows in detail the portion "A" of the backlight unit 15 shown in FIG. 3.

Referring to FIG. 4, the light source 200 may be configured by an optical assembly including a light emitting device 201 that emits light, such as a top view type of LED package, and a lens 202 disposed above the light emitting device 201. The light emitted from the light emitting device 201 is emitted upward at a predetermined directional angle after passing through the lens 202.

In this case, the thickness H of the backlight unit 15 should be 0.3 or more times the gap P between the light emitting devices 201 in order to maintain uniformity of light emitted from the backlight unit and it may be difficult to manufacture the backlight unit 15 with a small thickness due to this limit.

According to an exemplary embodiment of the present invention, it is possible to implement the backlight unit 15 having a small thickness and high optical efficiency by totally reflecting the light emitted from the light emitting device 201 downward to the side.

Figure 5:
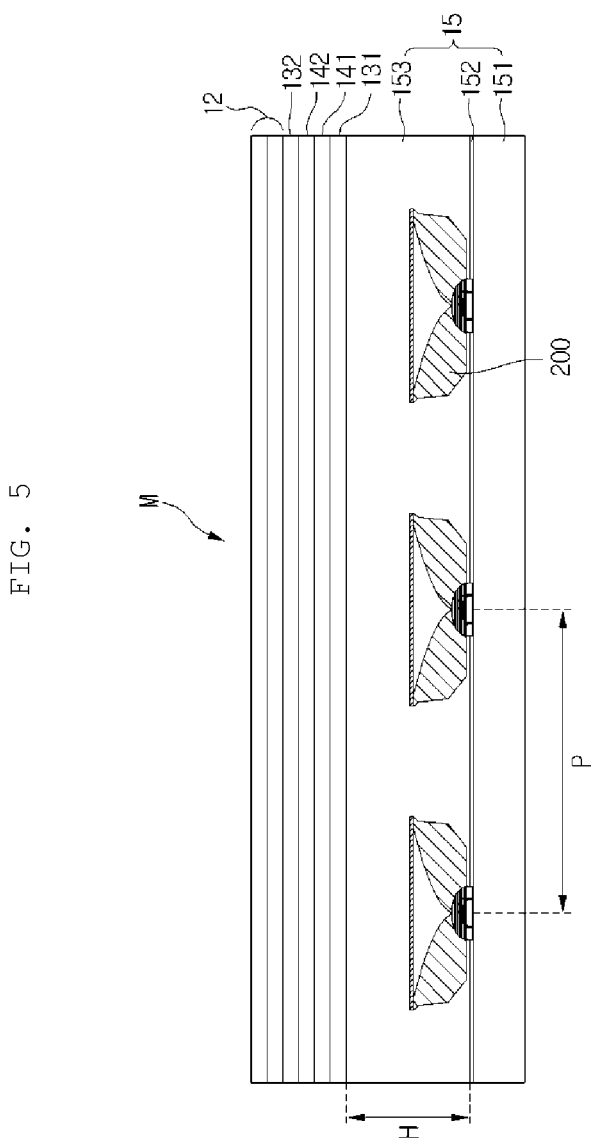
FIG. 5 is a cross-sectional view showing the configuration of a display module according to an exemplary embodiment of the present invention.

FIG. 5 is a cross-sectional view showing the configuration of a display module according to an exemplary embodiment of the present invention and a display module M includes the display panel 12, the optical sheets 13 and 14, and the backlight unit 15.

Referring to FIG. 5, the display panel 12 includes color filter substrates that are bonded and opposite each other to maintain a cell gap and a TFT (Thin Film Transistor) substrate provided under the color filter substrates.

The color filter substrate includes a plurality of pixels composed of red (R), green (G), and blue (B) sub-pixels, and can generates an image corresponding to the color of red, green, or blue when light is applied. Meanwhile, although the pixels may be composed of red, green, and blue sub-pixels, the pixels are not necessarily limited thereto and may be configured in various combinations, such as when red, green, blue, and white (W) sub-pixels constitute one pixel.

The TFT substrate is a switching device and can switch pixel electrodes (not shown). For example, a common electrode (not shown) and the pixel electrode can change the arrangement of the molecules in the liquid crystal layer in accordance with a predetermined voltage applied from the outside.

The liquid crystal layer is composed of a plurality of liquid crystal molecules and the liquid crystal molecules change the arrangement in accordance with a voltage difference generated between the pixel electrode and the common electrode. Therefore, the light provided from the backlight unit 15 can travel into a color filter substrate in accordance with a change in molecule arrangement of the liquid crystal layer.

Further, the display panel 12 may further include a lower polarizer provided on the underside of the TFT substrate and an upper polarizer seated on the upper surface of the color filter substrate.

Further, the backlight unit 15 may further include optical sheets 13 and 14 placed under the display panel 12. In detail, the optical sheets 13 and 14 may include a diffusion plate 131 that diffuse the light emitted upward from the backlight unit 15, prism sheets 141 and 142 that concentrate the light diffused by the diffusion plate 131, and a diffusion sheet 132 that diffuses again the light concentrated by the prism sheets 141 and 142. In some cases, a protective sheet (not shown) may be placed on the upper surface of the diffusion sheet 132, instead of the diffusion sheet 132.

For example, it is necessary to prevent a hot spot where the light emitted from the light sources 200 is partially concentrated, by using the diffusion plate 131. Further, the diffusion plate 131 also functions to turn the direction of the light, which travels to the prism sheets 141 and 142, to be vertical.

The prism sheet 141 and 142 may include a first prism sheet 141 having a transversely-wrinkled surface and a second prism sheet 142 having a longitudinally-wrinkled surface. The first prism sheet 141 concentrates light traveling toward the second prism sheet 142 in the front-rear direction and the second prism sheet 142 concentrates the light traveling toward the diffusion sheet 132 in the left-right direction. Accordingly, the light traveling from the diffusion plate 131 to the diffusion sheet 132 can be vertically turned and keep traveling.

Further, the light is uniformly distributed throughout the surface of the display panel 12 while passing through the diffusion sheet 131, so that the brightness is not only made uniform, but improved.

Meanwhile, the backlight unit 15 may include the first layer 151 implemented by a PCB substrate, the light sources 200 mounted on the upper surface of the first layer 151, a second layer 152 placed on the upper surface of the first layer 151, and a light guide plate 153 placed on the upper surface of the second layer 152.

The light guide layer 153 is provided to cover the light sources 200 and can allow the light emitted from the light sources 200 to be uniformly provided to the display panel 12 by transmitting and diffusing the light emitted from the light sources 200 toward the display panel 12. For example, the light guide layer 153 may be an air layer, or may be filled with a light-transmissive material such as silicon or acryl-based resin.

Further, the second layer 152 is a layer for extracting or reflecting the light emitted from the light sources 200 to the display panel 12 and also called a light extraction layer or a reflective layer. A light extraction pattern may be formed on the upper surface of the second layer 152 such that light emitted and hit from the light sources 200 is effectively extracted to the display panel 12. Since the light extraction pattern has a function of allowing the light emitted from the light source 200 to be diffused with uniform brightness to an adjacent light source, it is also called a diffusion pattern.

Further, the light source 200 may be a light emitting diode (LED) chip or one of a package of light emitting diodes equipped with at least one light emitting diode chip. The exemplary embodiment exemplifies that a package of light emitting diodes is provided as the light source 200.

As shown in FIG. 5, the light source 200 according to an exemplary embodiment of the present invention totally reflects the light emitted from a light emitting device downward to the side in the lens and the light reflected downward to the side may be reflected from the second layer 152.

It is possible to reduce the thickness of the backlight unit 15 and improve light efficiency and uniformity of luminance, using the side-downward light emission type of light source 200 according to an exemplary embodiment of the present invention described above.

Hereinafter, the configuration of an optical assembly according to an exemplary embodiment of the present invention will be described in detail with reference to FIGS. 6 to 32.

Figure 6:
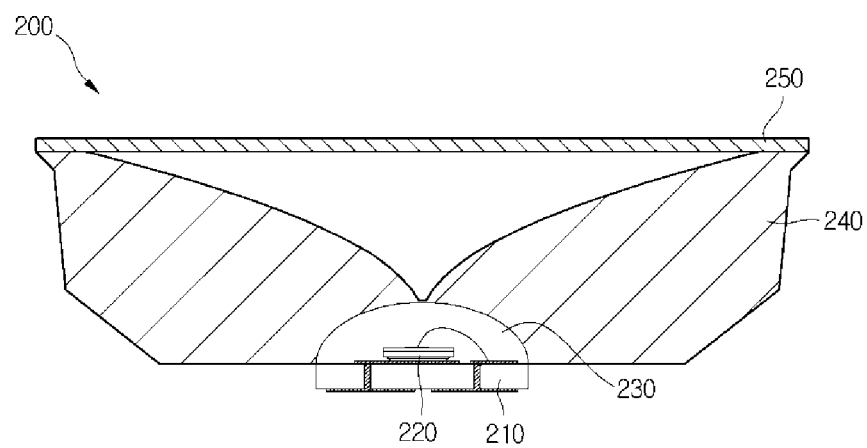
FIG. 6 is a cross-sectional view showing the configuration of an optical assembly according to an exemplary embodiment of the present invention.

FIG. 6 is a cross-sectional view showing the structure of an optical assembly according to an exemplary embodiment of the present invention and shows the cross-sectional structure of the light source including a light emitting device and a lens, as described with reference to FIGS. 1 to 5.

Referring to FIG. 6, the light source 200 may include a main body portion 210, a light emitting device 220 mounted on the upper surface of the main body portion 210, a lens 240 disposed above the light emitting device 220, and a light shielding layer 250 placed on the upper surface of the lens 240.

For example, a sub-mount substrate constituting the main body portion 210 is made of a transparent material, and may be made of a material such as glass, transparent ceramic, or a transparent polymer containing resin. Further, the light emitting device 220 may be an LED device, as described above.

Meanwhile, the lens 240 may have a parabolic light emission surface to send the light to the sides by inducing total reflection of the light emitted from the light emitting device 220. For example, the center portion of the lens 240 may be recessed to a small distance from the upper portion of the light emitting device 220 such that the portion from the center portion to the edge describes a parabola.

Therefore, some of the light emitted from the light emitting element 220 and traveling into the lens 240 is reflected downward to the side and dispersed into the light guide layer 113 by total reflection due to a difference in refractive index of the medium at the upper surface portion of the parabolic lens 240.

Further, the other of the light traveling from the lens 240 is refracted at the upper surface portion of the parabolic lens 240 and travels to the display panel 12.

Further, the light totally reflected downward to the side from the lens 240 may be reflected upward toward the display panel 12 from the second layer 152.

Meanwhile, the space 230 between the light emitting device 220 and the lens 240 may be an air layer. According to another exemplary embodiment of the present invention, the space 230 between the light emitting device 220 and the lens 240 may be another lens and the lens disposed in the space 230 may be made of resin mixed with phosphor on the upper surface of the light emitting device 220 by molding.

Meanwhile, a light shielding layer 250 with a light shield pattern may be placed on the upper surface of the lens 240 and may be configured by a metal sheet including silver or aluminum having a high reflectance.

The light passing through the lens 240 travels into the light shielding layer 250 and a portion of the light traveling into the light shielding layer 250 travels toward the display panel 12 through the light shielding layer 250. Further, the other of the light may be reflected downward to the side from the light shielding layer 250.

That is, it is possible to prevent a hot spot from being generated around the light source and to make the brightness of the backlight unit 15, by forming a light shielding pattern that performs a light reflection function at the light shielding layer 250. Further, it is possible to prevent a dark portion from being formed on the upper surface of the light source 200 by allowing some of the light passing through the lens 240 to pass through the light shielding layer 250.

As shown in FIG. 6, the light source 200 that is an optical assembly according to an exemplary embodiment of the present invention may include the light emitting device 220 and the lens 240 that is disposed above the light emitting device 220 and totally reflects at least some of the light emitted from the light emitting device 220, downward to the side.

Figure 7:
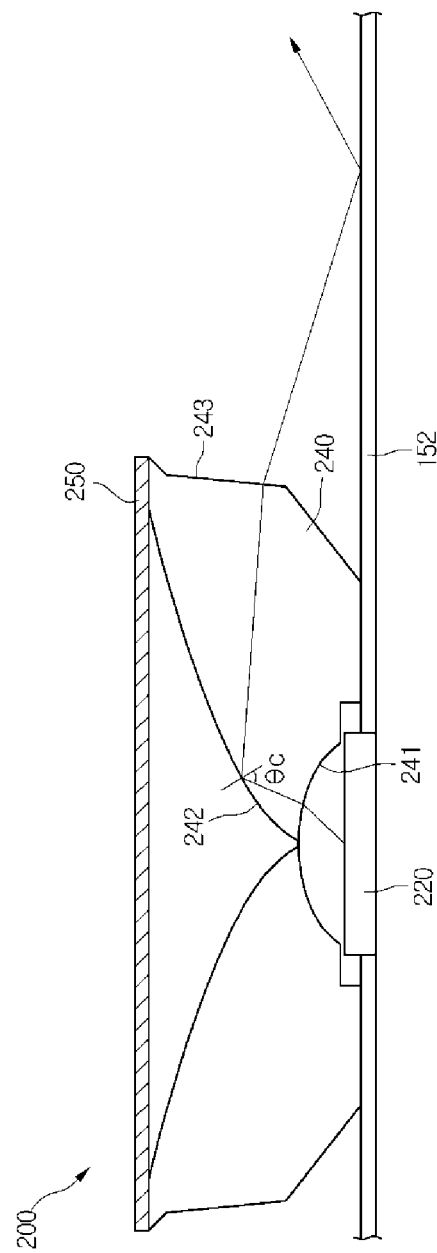
FIG. 7 is a view illustrating the function of the lens shown in FIG. 6.

Describing the structure of the lens 240 with reference to FIG. 7, the lens 240 may have a lower surface portion 241 through which light emitted from the light emitting device 220 travels inside, an upper surface portion 242 that totally reflects at least some of the light traveling inside through the lower surface portion 242 downward to the side, and a side portion 243 through which the light totally reflected from the upper surface portion 242 is discharged to the outside.

The lower surface portion 241 of the lens 240 may have a shape that is recessed upward to cover the light emitting device 220 and at least a portion of the lower surface portion 241 may have any one cross-sectional shape of a straight line, a triangle, a circle, and an ellipse.

Further, the width of the uppermost end of the lens 240 is larger than the width of the lowermost end and may have a curved shape upward and outward with respect to the center axis. For example, the light discharged from the light emitting device 220 travels into the lower surface portion 241 of the lens 240 and the incident light may be refracted by the lower surface portion 241 and travels to the upper surface portion 242.

Meanwhile, the light discharged from the light emitting device 220 may be dispersed outward by a concave lens effect according to the shape of the lower surface portion 241 that is recessed upward, so that a yellowish phenomenon that may be generated on the upper surface of the lens 240 may be reduced.

The upper surface portion 242 of the lens 240 may have a shape recessed downward at the center portion and at least a portion of the upper surface portion 242 may have any one cross-sectional shape of a parabola, a circle, an ellipse, and an inclined straight line. For example, at least some of the light refracted by the lower surface portion 241 of the lens 240 may be totally reflected from the upper surface portion 242 and the other that is not totally reflected may be discharged upward through the upper surface portion 242.

The light of which the incident angle to the upper surface portion is a critical incident angle θc in the light refracted by the lower surface portion 241 of the lens 240, is reflected downward to the side by the lower surface portion 241 and travels toward the side portion 243, and the light of which the incident angle is smaller than the critical incident angle θc may be discharged upward through the upper surface portion 242. Meanwhile, the critical incident angle θc may be determined by the refractive index and the like of the substance of the lens 240.

The side portion may be formed to be inclined at a predetermined angle toward the inside of the lens 240 and may have any one cross-sectional shape of a straight line, a circle, a parabola, and an ellipse. For example, the light totally reflected from the upper surface portion 242 of the lens 240 may be refracted at an angle larger than the incident angle by the side portion 243 and then discharged.

The light discharged downward to the side through the side portion 243 is reflected from the second layer 152 configured by a reflective sheet and then may be discharge upward toward the display panel 12 or may travel to the side.

That is, according to an exemplary embodiment of the present invention, the light discharged from the light emitting device 220 has a light path through which the light travels into the lens 240 having a large refractive index from a substance (such as air) having a small refractive index and is then discharged back to the substance (such as air) having a small refractive index from the lens 240 having a large refractive index.

Meanwhile, the light that is not totally reflected from the upper surface portion of the lens 240, but is refracted upward is adjusted in luminance by the light shielding layer 250 disposed above the lens 240 and can prevent a hot spot or a dark portion from being generated in accordance with the position of the light emitting device 220.

Figure 8:
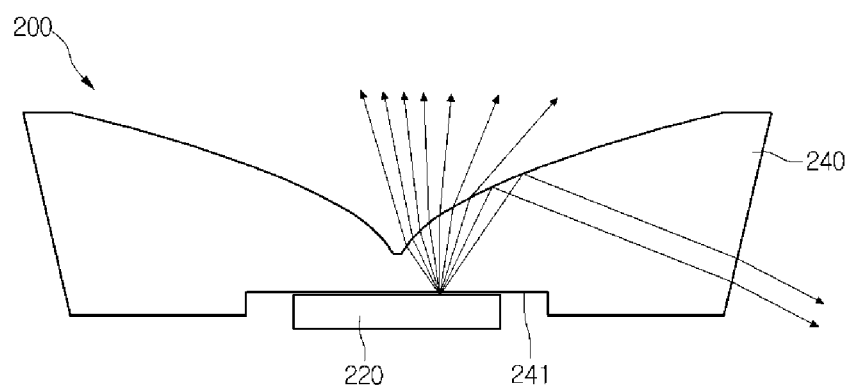
FIGS. 8 to 10 are views showing exemplary embodiments of the shape of a lower surface portion of the lens.
Figure 9:
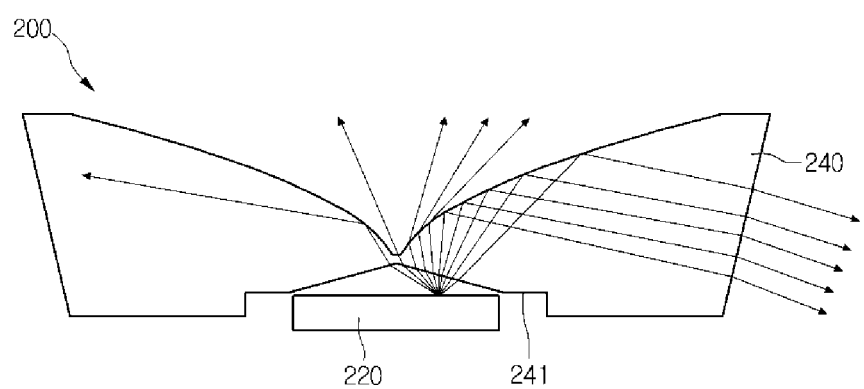
Figure 10:
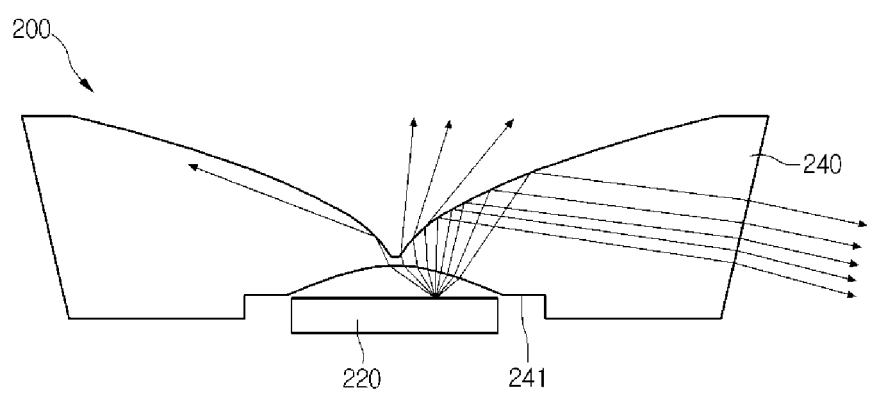

FIGS. 8 to 10 are cross-sectional views showing exemplary embodiments of the shape of the lower surface portion 241 of the lens 240.

Referring to FIG. 8, when the lower surface portion 241 of the lens 240 has a flat and straight cross-sectional shape, a small portion of the light travels inside from the lower surface portion 241 may be totally reflected downward to the side from the upper surface portion 242 and discharged through the side portion 243.

In this case, a large portion of the light discharged from the light emitting device 220 is discharged upward through the upper surface portion 242 of the lens 240, so that a strong hot spot may be generated around the region where the light emitting device 220 is positioned.

Referring to FIGS. 9 and 10, when the lower surface portion 241 of the lens 240 has a triangular, circular, or elliptical cross-section and has a shape recessed upward such as a prism or a non-spherical surface, a large portion of the light traveling inside from the lower surface portion 241 may be totally reflected downward to the side from the upper surface portion 242, in comparison to the case shown in FIG. 8.

In the cases shown in FIGS. 9 and 10, the hot spot that is generated around the area where the light emitting device 220 is positioned may be reduced.

Although exemplary embodiments of the shape of the lower surface portion 241 of the lens 240 was described above with reference to FIGS. 8 to 10, the present invention is not limited thereto and the lower surface portion 241 may be changed in various shapes in consideration of uniformity of the luminance and the image quality.

Figure 11:
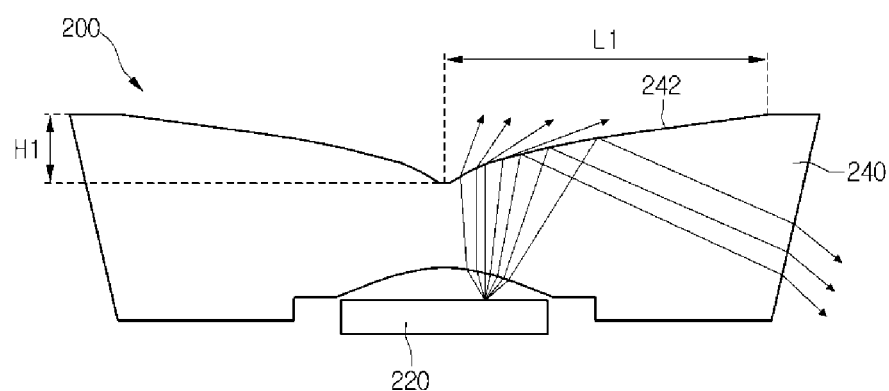
FIGS. 11 to 13 are views showing exemplary embodiments of the shape of an upper surface portion of the lens.
Figure 12:
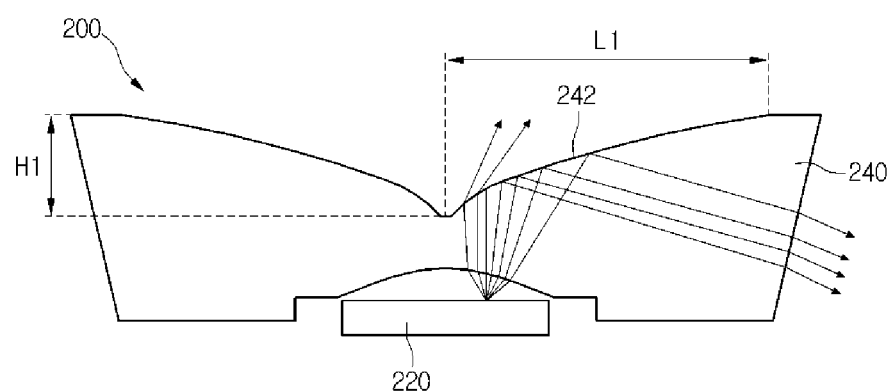
Figure 13:
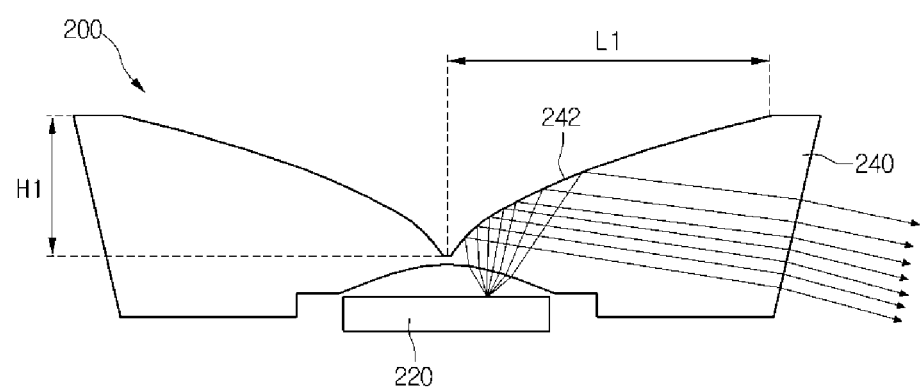

FIGS. 11 to 13 are cross-sectional views showing exemplary embodiments of the shape of the upper surface portion 242 of the lens 240.

Referring to FIG. 11, some of the light traveling inside through the lower surface portion 241 of the lens 240 may be totally reflected downward to the side from the upper surface portion 242 and the light totally reflected from the upper surface portion 242 may travel in parallel in the lens 240 toward the side portion 243.

For example, when the lens 240 is made of polycarbonate having a refractive index of about 1.58, the critical incident angle θc for total reflection by the upper surface portion 242 may be about 42 degrees by Snell's law. Accordingly, the shape of the upper surface portion 242 of the lens 240 configured by polycarbonate may be formed such that the incident angle of the light traveling inside through the lower surface portion 241 is larger than 42 degrees.

Meanwhile, the incident angle of the light traveling inside from the upper surface portion 242 may be determined by the depth H1 of the upper surface portion 242, the pitch L1 that is the distance from the center to the end of the upper surface portion 242, and the shape of the upper surface portion 242.

For example, when the pitch L1 of the upper surface portion is 6.5 mm and the depth H1 of the upper surface portion is 1.3 mm (H1/L1=0.2), a large portion of the light discharged from the light emitting device 220 is discharged upward through the upper surface portion 242 of the lens 240, so that a strong hot spot may be generated around the region where the light emitting device 220 is positioned.

Referring to FIG. 12, when the pitch L1 of the upper surface portion is 6.5 mm and the depth H1 of the upper surface portion is 1.95 mm (H1/L1=0.3), a large portion of the light discharged from the light emitting device 220 is totally reflected from the upper surface portion 242 of the lens 240 and may be discharged to the side through the side portion 243.

Further, referring to FIG. 13, when the pitch L1 of the upper surface portion is 6.5 mm and the depth H1 of the upper surface portion is 2.6 mm (H1/L1=0.4), most of the light discharged from the light emitting device 220 is totally reflected from the upper surface portion 242 of the lens 240 and may be discharged to the side through the side portion 243. That is, as the depth H1 of the upper surface portion to the pitch L1 of the upper surface portion increases, total reflection of the light by the upper surface portion 242 may be increased.

On the contrary, as the depth H1 of the upper surface portion to the pitch L1 of the upper surface portion decreases, the light having an incident light smaller than the critical incident light θc increases and the light discharged upward through the upper surface 242 increases, so that a strong hot spot is generated and light efficiency may be deteriorated.

Therefore, according to an exemplary embodiment of the present invention, the shape of the upper surface portion 242 of the lens 240 may be designed such that the depth H1 of the upper surface to the pitch H1 of the upper surface has a predetermined value or more.

The H/P value of the upper surface portion 242 of the lens 240 may be defined by a value obtained by dividing the depth H1 of the upper surface by the pitch L1 of the upper surface in the following description.

Figure 14:
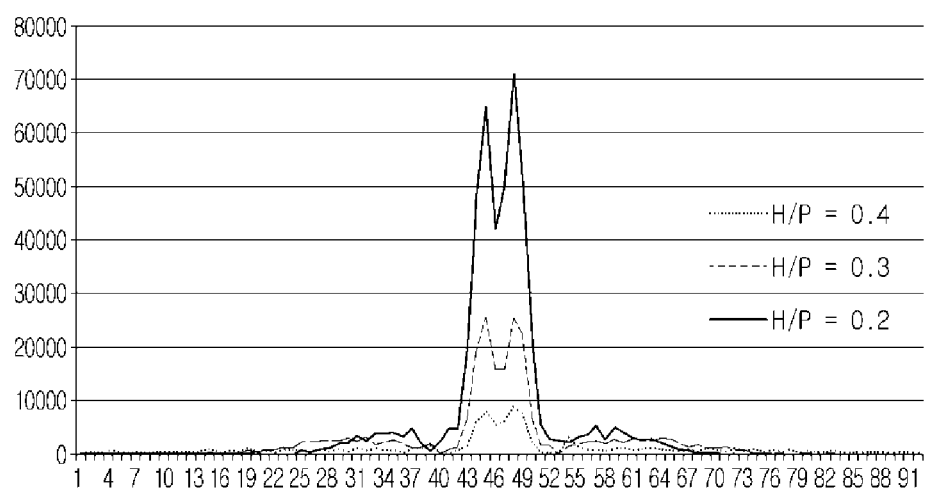
FIG. 14 is a graph showing changes in illumination distribution according to the shapes of the upper surface portion of the lens.

FIG. 14 is a graph showing changes in luminance distribution according to the shapes of the upper surface portion 242 of the lens 240.

Referring to FIG. 14, it can be seen that the HP value of the upper surface 242 of the lens 240 decreases, the hot spot at the upper portion of the lens 240 increases in size, so that the loss of light increases.

Therefore, as described above, the H/P value of the upper surface portion 242 may be set to a predetermined value or more in order to minimize the loss of light and uniformly diffuse the light discharged from the light emitting device 220 in a desired direction.

TABLE 1

| H/P | 0.4 | 0.3 | 0.2 |
|---|---|---|---|
| Loss of light (%) | 5.80% | 14.50% | 37% |

Referring to Table 1, it can be seen that as H/P of the upper surface portion 242 increases, the hot spot decreases and the loss of light is reduced, and the loss of light is 37% which is very large, when H/P is 0.2. Meanwhile, when H/P is 0.3, the loss of light is 14.5%, and when H/P decreases under 0.3, the loss of light rapidly increases, so that the H/P value of the upper surface portion 242 may be set to 0.3 or more.

That is, the shape of the upper surface portion 242 may be designed such that the depth H1 of the upper surface portion 242 of the lens 240 is 0.3 times or more the distance L1 from the center portion to the end of the upper surface portion 242, in order to minimize the loss of light and reduce the thickness of the backlight unit 15.

Figure 15:
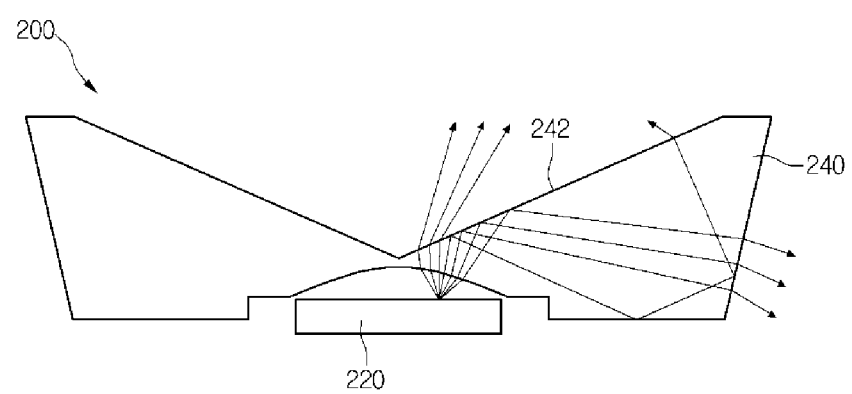
FIGS. 15 and 16 are views showing other exemplary embodiments of the shape of an upper surface portion of the lens.
Figure 16:
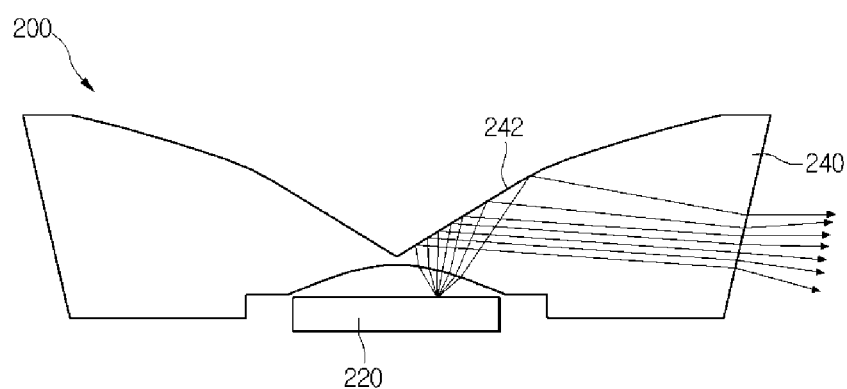

FIGS. 15 and 16 are views showing other exemplary embodiments of the shape of the upper surface portion 242 of the lens 240, that is, show when the cross-sectional shape of the upper surface portion 242 is an inclined straight line and a circle, respectively.

Comparing when the cross-sectional shape of the upper surface portion 242 is a parabola, as shown in FIG. 13, with when the cross-sectional shape is a straight line or a circle, as shown in FIGS. 15 and 16, it can be seen that light is dispersed in the straight line shape, parallel light is discharged in the parabolic shape, and light is concentrated in the circular shape.

When the light totally reflected from the upper surface portion 242 of the lens 240 travels in parallel, the light can be further sent and uniformity of luminance can be maintained, so that the upper surface portion 242 of the lens 240 according to an exemplary embodiment of the present invention may have a parabolic cross-sectional shape.

On the other hand, when the upper surface portion 242 has a parabolic cross-sectional shape, and assuming that the light emission surface of the light emitting device 220 is very small and it is a point light source, light coming out from the focus of the parabola is reflected by the parabola and comes out as parallel light, so that it is possible to adjust the shape of the parabola such that the distribution of light totally reflected is in parallel in accordance with the distance and position from the upper surface portion 242 and the light emitting device 220.

In detail, the shape of a figure having predetermined surface curvature may be determined by the following equation, $$Z = \frac{CY^2}{1 + \sqrt{1 - (1+K)C^2Y^2}}$$

where variables and constants in the equation mean values as follows.

Z: transverse axial value of figure (transverse axial value in FIG. 13)
Y: longitudinal axial value of figure (longitudinal axial value in FIG. 13)
C: surface curvature of figure
K: conic constant, K=−1 when figure is parabola and K=0 when figure is circle In the exemplary embodiment shown in FIG. 13, since K=−1 when the figure is a parabola, the equation is determined as follows.

$$Z = \tfrac{1}{2}CY^2$$

In the equation, light is totally reflected in parallel when the surface curvature of the parabola corresponding to the cross-sectional shape of the upper surface portion 242 of the lens 240 is ¼ to 4, uniformity of luminance can be ensured.

Although exemplary embodiments of the shape of the upper surface portion 242 of the lens 240 was described above with reference to FIGS. 11 to 16, the present invention is not limited thereto and the lower surface portion 241 may be changed in various shapes in consideration of uniformity of the luminance and the image quality.

Figure 17:
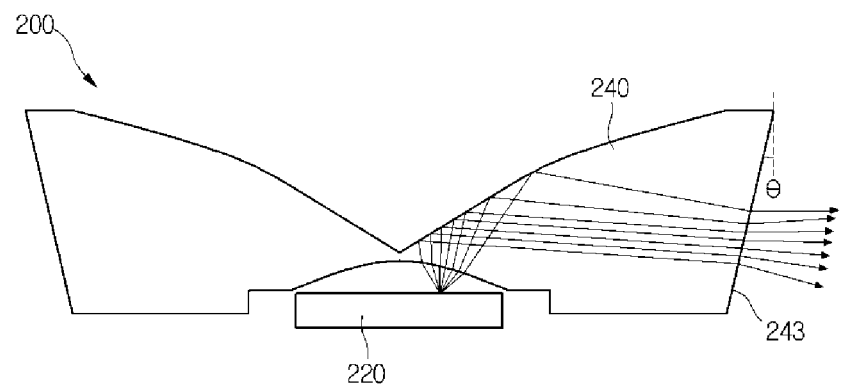
FIGS. 17 to 19 are views showing exemplary embodiments of the shape of a side portion of the lens.
Figure 18:
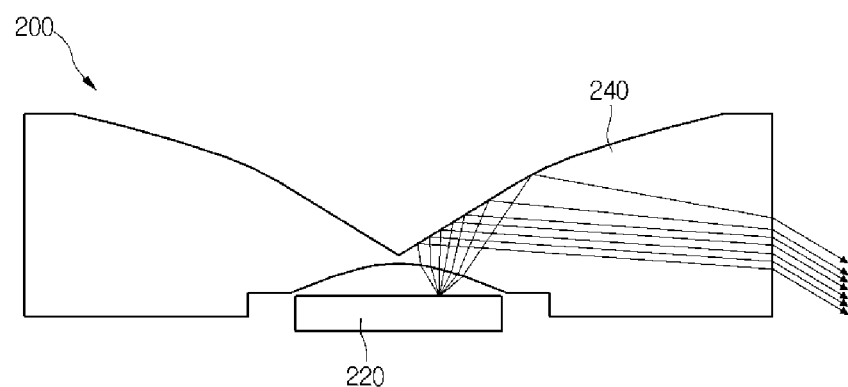
Figure 19:
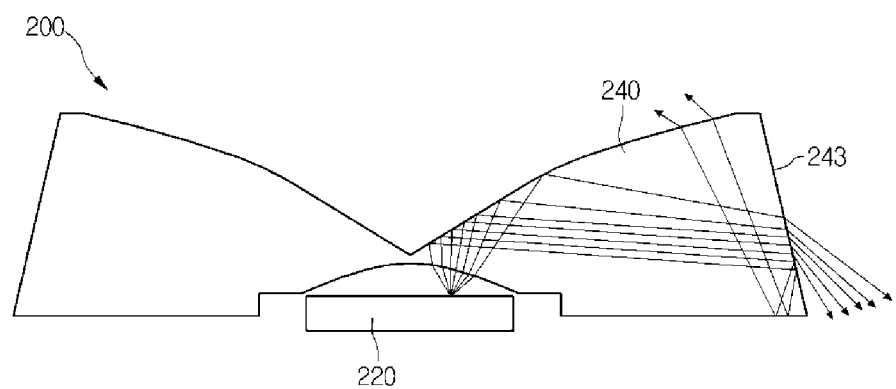

FIGS. 17 to 19 are views showing exemplary embodiments of the shape of the side portion 243 of the lens 240.

Referring to FIG. 17, the side portion 243 of the lens 240 may be inclined at a predetermined angle θ toward the inside of the lens 240. When the inclination angle θ of the side portion 243 is larger than 0 degree (for example, 25 degrees), the light totally reflected from the upper surface portion 242 of the lens 240 can be refracted at an angle larger than the incident angle by the side portion 243 and uniformly dispersed far from the light source 200.

Referring to FIG. 18, when the inclination angle θ of the side portion 243 is 0 degree, since the light is refracted at an exit angle smaller than the incident angle, the light may not be dispersed far as compared with the case shown in FIG. 17.

Meanwhile, as shown in FIG. 19, when the side portion 243 of the lens 240 is inclined outward from the lens 240, that is, when the inclination angle θ of the side portion 243 is smaller than 0 degree (for example, 25 degree), some of the light totally reflected from the upper surface portion 242 cannot be refracted by the side portion 243 and may be totally reflected into the lens 240. However, the other of the light totally reflected from the upper surface portion 242 may be dispersed to the outside and the light can be dispersed far from the light source 200, as compared with when the inclination angle θ of the side portion 243 is 0 degree.

In order to uniformly sent the light discharge from the light emitting device 220 far, the inclination angle θ of the side portion 243 of the lens 240 which is inclined toward the inside of or outward from the lens 240 may be 0 degree to 45 degrees.

Figure 20:
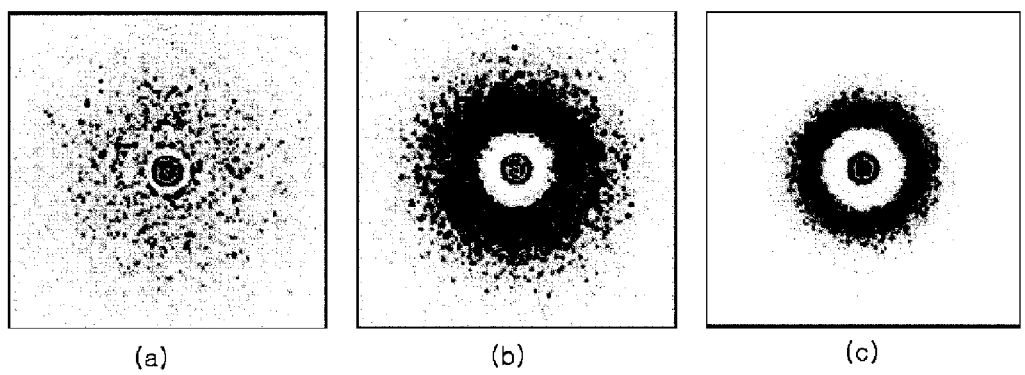
FIG. 20 is a view showing changes in illumination distribution according to the shapes of the side portion of the lens.

FIG. 20 shows changes in luminance distribution according to the shapes of the side portion 243 of the lens 240, in which (a) shows when the inclination angle θ of the side portion 243 is 14 degrees, (b) shows when the inclination angle θ of the side portion 243 is 0 degree, and (c) shows when the inclination angle θ of the side portion 243 is −14 degrees.

Referring to FIG. 20, it can be seen that light uniformly dispersed far, as the inclination angle θ of the side portion 243 increases. However, the inclination angle θ of the side portion 243 may have an optimized upper limit value in accordance with the distance H between the light emitting devices 220 and the optical thickness H of the backlight unit 15.

Although exemplary embodiments of the shape of the side portion 243 of the lens 240 was described above with reference to FIGS. 17 to 20, the present invention is not limited thereto and the side portion 243 may be changed in various shapes in consideration of uniformity of the luminance and the image quality. For example, the cross-sectional shape of the side portion 243 may have various shapes such as a circle, an ellipse, or a parabola, other than the straight line shape shown in FIGS. 17 to 20.

Further, a portion of the side portion 243 of the lens 240 may have a shape that is convex outward and the other portion may have a shape that is concave outward.

FIG. 21 shows a light emission distribution of a lens according to an exemplary embodiment of the present invention, that is, light emission distribution of the lens having an optimized shape when the distance H between the light emitting devices 220 is 65 mm and the optical thickness H of the backlight unit 15 is 8.5 mm.

Referring to FIG. 21, when the lens 240 has the optimized shape, as described above, most of light may be discharged downward, close to the horizontal direction, and may not be discharged upward.

Figure 22:
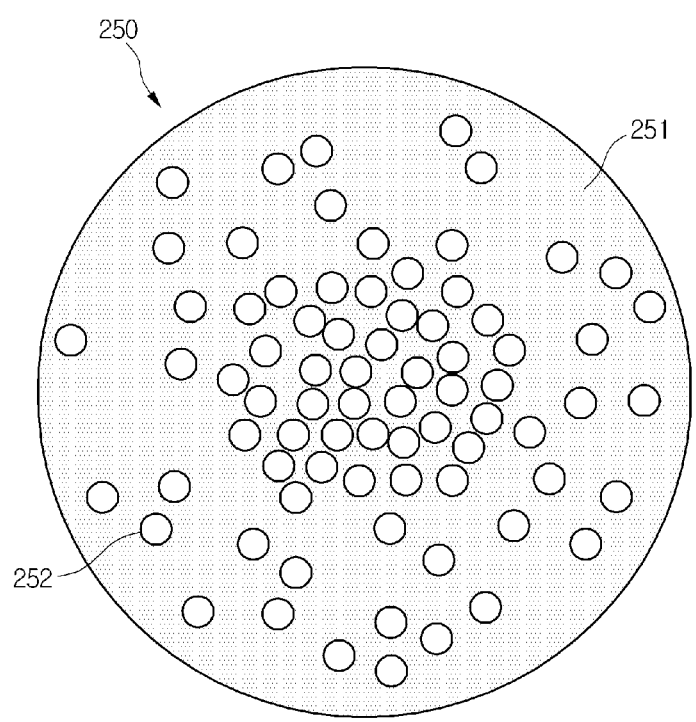
FIG. 22 is a view showing an exemplary embodiment of the configuration of a light shielding layer.

FIG. 22 is a view showing an exemplary embodiment of the configuration of the light shielding layer 250 disposed above the lens 240.

Referring to FIG. 22, the light shielding layer 250 may be configured by forming a plurality of patterns 252 on a base sheet 251. For example, the base sheet 251 may be a white reflective sheet and the patterns 252 may be formed by punching the base sheet 251.

In this case, the patterns 252 formed on the light shielding layer 250 transmit light emitted upward through the upper surface portion 242 of the lens 240 and it is possible to adjust light emission to the display panel 12 by adjusting the density of the patterns 252 in accordance with the position.

As shown in FIG. 22, the patterns 252 are formed with high density at the center portion of the light shielding layer 250 and may be formed such that the density decreases toward the outside. Therefore, the light refracted upward through the upper surface portion 242 of the lens 240 may be further emitted upward through the center portion than the edge portion of the light shielding layer 250, so that the generation of a dark portion may be reduced at the position corresponding to the center portion of the lens 240.

Meanwhile, the light shielding layer 250 may be configured by printing the patterns 252 that block lights onto the base sheet 251.

According to an exemplary embodiment of the present invention, it is possible to provide uniform light to the display panel 12 by adjusting the density of the patterns 252 of the light shielding layer 250 in accordance with the position.

Figure 23:
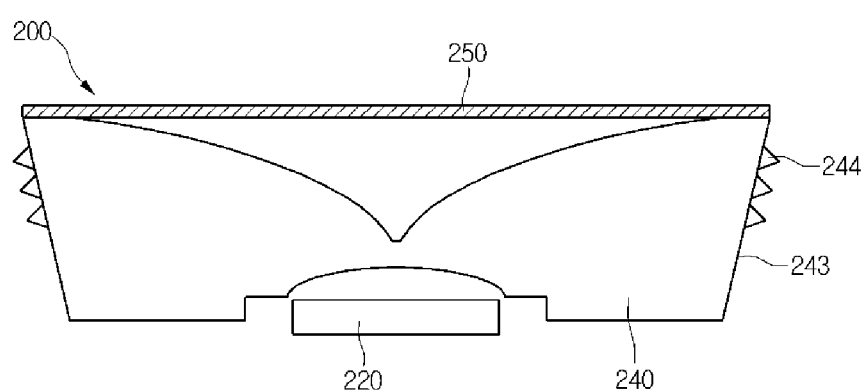
FIG. 23 is a view showing an exemplary embodiment of the configuration of protruding patterns formed on the side portion of the lens.

FIG. 23 shows an exemplary embodiment of the shape of the side portion 243 of the lens 240.

Referring to FIG. 23, protrusion patterns 242 that protrude outward may be formed at the side portion 243 of the lens 240. For example, the light totally reflected from the upper surface 242 of the lens 240 can be more uniformly dispersed to the side by the protrusion patterns 252 formed at the side portion 243.

The protrusion patterns 242 formed at the side portion 243 may be integrally made of the same material as that of the lens 240, but the present invention is not limited thereto and the protrusion patterns 242 may be separately made of a material different from the lens 240 at the side portion 243.

Figure 24:
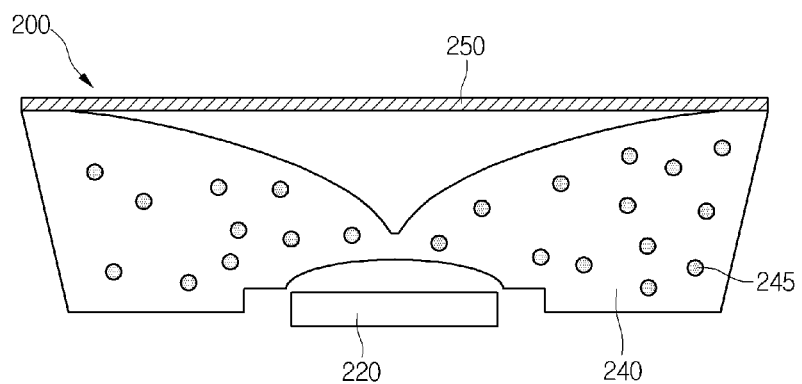
FIG. 24 is a view showing an exemplary embodiment of the configuration of diffusion particles distributed in the lens.

Referring to FIG. 24, a plurality of particles 245 that disperses light is distributed in the lens 240, so that uniformity of luminance can be improved at the upper portion of the lens 240. The diffusion particles 245 may allow the light traveling into the lens 240 to be more widely dispersed therein, by dispersing or refracting the incident light.

The diffusion particles 245 may be made of a material having a refractive index different from that of the material of the lens 240, in more detail, a material having a higher refractive index than silicon-based or acryl-based resin of the lens 240, in order to disperse or refract the light traveling into the lens 240. For example, the diffusion particles 245 may be made of photo polymetyl methacrylate/styrene copolymer (MS), polymethyl methacrylate (PMMA), polystyrene (PS), silicon, titanium dioxide (TiO2), or silicon dioxide (SiO2), or a combination of the substances. However, the substance of the diffusion particles 245 are not limited to the substance described above, and various macromolecular substances or inorganic particles may be used.

Figure 25:
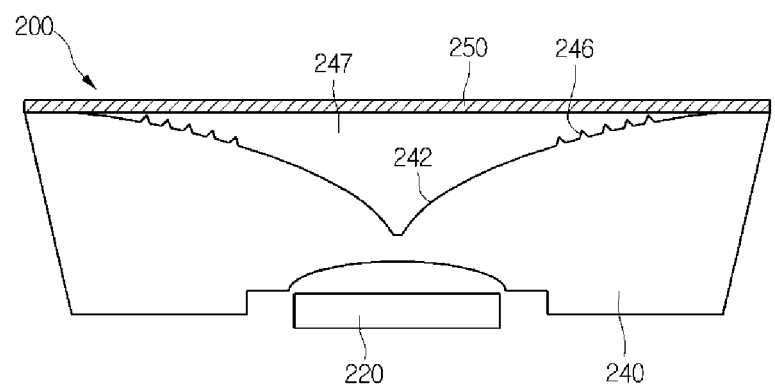
FIG. 25 is a view showing an exemplary embodiment of the configuration of light emission patterns formed on the upper surface portion of the lens.

Referring to FIG. 25, a plurality of light emission patterns 246 having a shape that is convex upward may be formed on the upper surface portion 242 of the lens 240.

Since light is not totally reflected at the position where the light emission patterns 246 are formed, in the upper surface portion 242, it is reduce generation of a dark portion due to total reflection by the upper surface portion 242 by adjusting the positions and density of the light emission patterns 246. Further, a specific second lens that improves uniformity of luminance at the upper portion of the lens 240 may be disposed in a space 247 between the lens 240 and the light shielding layer 250.

Figure 26:
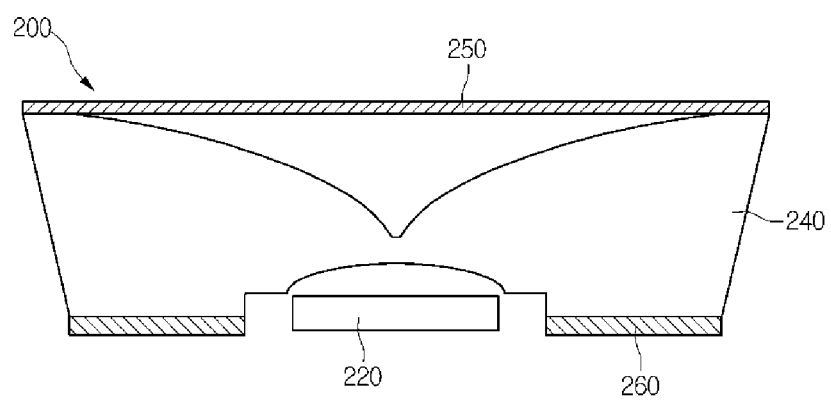
FIG. 26 is a view showing an exemplary embodiment of the configuration of a diffusion layer disposed at the underside of the lens.

Referring to FIG. 26, a diffusion layer 260 that diffuses light may be disposed on the underside of the lens 240. The diffusion layer 260 may improve a yellow ring or a pyroxenite portion that may be generated by color separation by mixing light that is separated in color by the lens 240.

Figure 27:
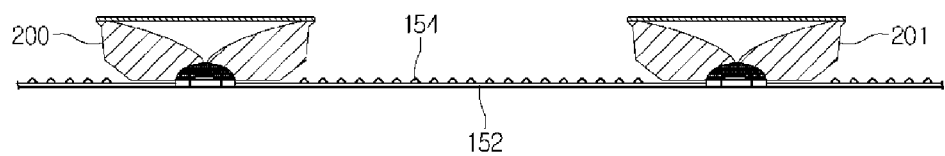
FIGS. 27 and 28 are views showing exemplary embodiments of the configuration of a reflective sheet.
Figure 28:
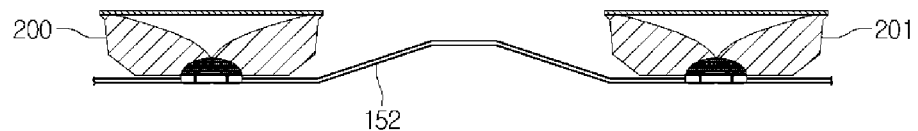

FIGS. 27 and 28 show exemplary embodiments of the configuration of a reflective sheet, that is, show exemplary embodiments of the configuration of the second layer 152 shown in FIG. 5.

Referring to FIG. 27, a reflective sheet 152 is disposed under the light source 200 and may function to uniformly move up the light guided downward to the side through the side portion 243 of the lens 240.

Meanwhile, a plurality of embossed or intagliated patterns 154 is formed on the reflective sheet 152, so that it is possible to adjust uniformity of light. For example, a plurality of embossed patterns 154 protruding upward may be formed on the reflective sheet 152 and light traveling into the patterns 154 after being discharged from the light source 200 may be dispersed and reflected in the traveling direction.

According to an exemplary embodiment of the present invention, the density of the patterns 154 formed on the reflective sheet 152 may increase, as the patterns 154 move away from the light source 200, that is, move closer to an adjacent light source 201. Therefore, it is possible to prevent reduction of the light emitted upward at the region spaced far from the light source 200, that is, the region close to the adjacent light source 201, so that it is possible to keep the brightness of the light provided from the backlight unit 15 uniform.

Further, the patterns 154 may be made of the same substance as that of the reflective sheet 152, in which the patterns 154 may be formed by processing the upper surface of the reflective sheet 152.

Unlike, the patterns 154 may be made of a substance different from that of the reflective sheet 152, and for example, the patterns 152 may be formed on the upper surface of the reflective sheet 152 by diffusing or coating particles onto the upper surface of the reflective sheet 152.

Meanwhile, the shape of the patterns 154 is not limited to that shown in FIG. 27 and various shape such as a prism may be possible, and the patterns 154 formed on the reflective sheet 152 may have an intagliated shape and the patterns 154 may be formed at only some regions in the reflective sheet 152.

Referring to FIG. 28, it may be possible to bend upward a portion of the reflective sheet 152 to prevent reduction of brightness of the light discharged upward at the region spaced far from the light source 200.

Figure 29:
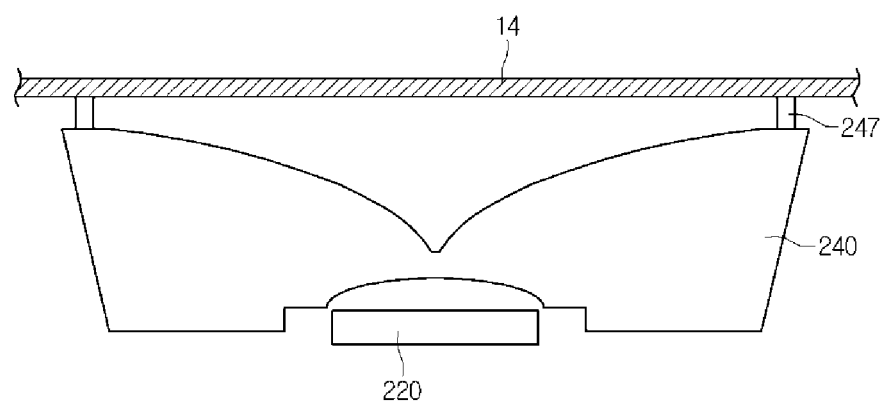
FIGS. 29 and 30 are views showing exemplary embodiments of protrusions formed on the lens to support an optical sheet.

Referring to FIG. 29, protrusions 247 for supporting an optical sheet 14 at the upper portion may be formed at the upper surface portion 242 of the lens 240.

That is, as described with reference to FIG. 5, it is possible to maintain the gap between the backlight unit 15 and the optical sheet 14 by forming the protrusions 247 for supporting and fixing the diffusion plates 131 and 132 and the prism sheets 141 and 142 at the upper surface portion 242 of the lens 240. Therefore, a specific support mold for fixing the optical sheet 14 is not necessary.

Figure 30:
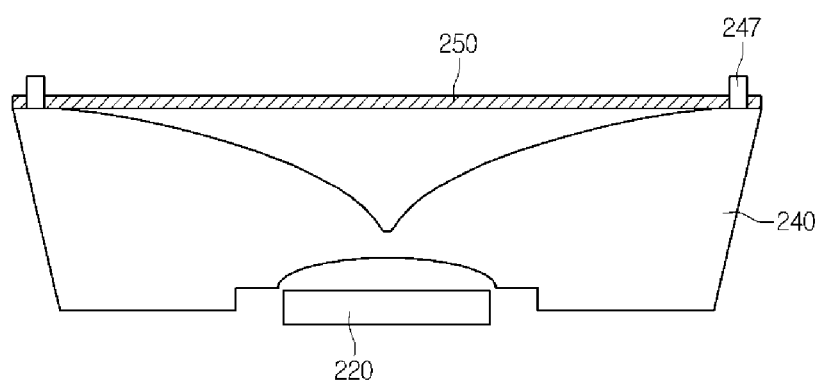

Referring to FIG. 30, the light shielding layer 250 described above may be mounted on the lens 240 for each lens. Further, holes are formed in the light shielding layer 250 and the light shielding layer 1250 may be fastened and fixed to the protrusions 247 formed at the upper surface portion 242 of the lens 240 through the holes.

Figure 31:
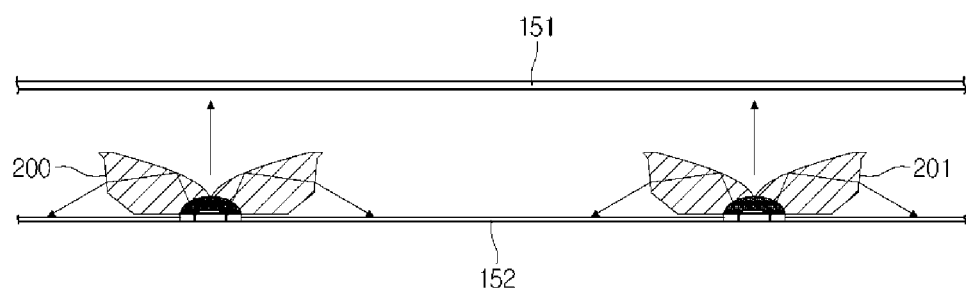
FIG. 31 is a view showing another exemplary embodiment of the configuration of the light shielding layer.

Meanwhile, the light shielding layer 250, as shown in FIG. 31, may not be mounted on the lens 450 for each lens, but may be disposed generally above the light sources 200 and 201.

Figure 32:
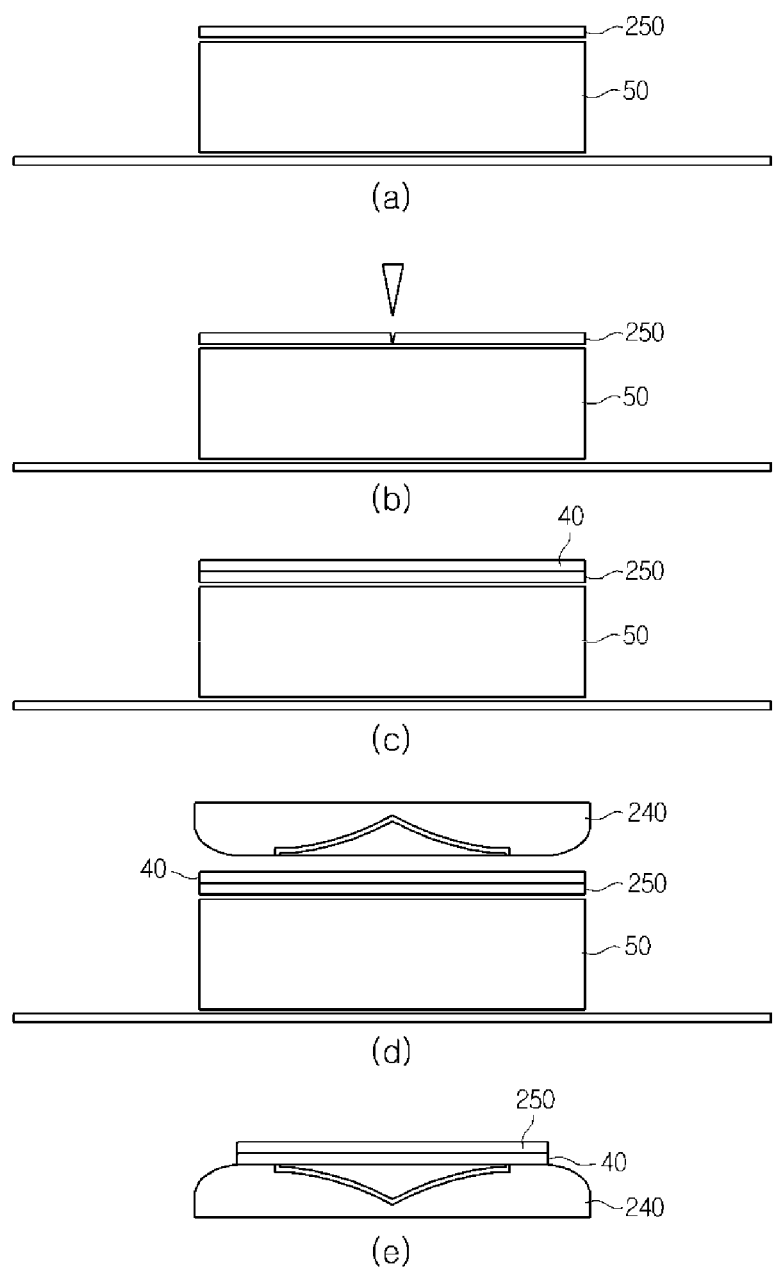
FIG. 32 is a view showing an exemplary embodiment of a method of forming the light shielding layer.

FIG. 32 shows an exemplary embodiment of a method of forming the light shielding layer.

Referring to FIG. 32, as shown in (a), a jig 50 with a film for forming the light shielding layer 250 placed is prepared first.

Further, as shown in (b), a process of forming a light shielding pattern is performed, with the light shielding film on the upper surface of the jig 50. In the figure, a light shielding pattern is formed by punching the light shielding film. That is, the pattern formed by punching may be considered as a transmissive pattern that transmits light passing through the lens 240. However, the light shielding pattern may be formed in the opposite way of the provided method.

For example, a transparent light shielding pattern is seated onto the jig 50 and a reflective substance may be deposited or printed onto one side of the light shielding film. The reflective substance may be a substance having high reflectivity, as described above, and a metallic substance such as aluminum or silver may be exemplified. Further, a plurality of light shielding substances may be deposited or printed onto the light shielding film like dots to form one pattern.

Meanwhile, when the process of forming a light shielding pattern is finished, as shown in (c), a process of applying an adhesive 40 is performed. Further, when the process of applying the adhesive 40 is finished, as shown in (d), the light source 20, in detail, the upper surface of the lens 240 is brought in close contact with the surface of the light shielding film where the adhesive 40 is applied.

In detail, the light source 200 is turned over such that the upper surface of the lens 240 faces the surface where the adhesive 40 is applied, with the jig 50 left. In this state, the lens 40 and the light shielding film are bonded by moving down the light source 200 or moving up the jig 50.

When this process is finished, as shown in (e), a light source with the light shielding layer 250 on the upper surface of the lens 240 may be completed.

According to an exemplary embodiment of the present invention, it is possible to reduce the thickness of a backlight unit and it is correspondingly possible to improve the external appearance of a display apparatus including the backlight unit.

Further, since the light source of the backlight unit is provided with a lens structure that totally reflects light emitted from the light emitting device, downward to the side, it is possible to improve light efficiency and uniformity of luminance, and accordingly, it is possible to improve the quality of an image displayed on a display apparatus.

According to the present invention, it is possible to reduce the thickness of a backlight unit and it is correspondingly possible to improve the external appearance of a display apparatus including the backlight unit, so that industrial applicability is very high.

Although the present invention was described above with reference to the exemplary embodiments, the exemplary embodiments are only examples and do not limit the present invention, and those skilled in the art would know that the present invention may be changed and modified in various ways not exemplified above without departing from the spirit of the present invention. For example, the components described in detail in the exemplary embodiments of the present invention may be modified. Further, differences relating to the changes and modifications should be construed as being included in the scope of the present invention which is determined by claims.

What is claimed is:

1. A display unit, comprising:
    a display panel; and
    a backlight unit disposed behind the display panel and including a plurality of light sources, each light source including a light emitting device and a lens disposed above the light emitting device,
    wherein the lens includes:
        a lower surface portion;
        a light source receiving portion recessed upwardly from the lower surface portion, the light source receiving portion including:
            a first recess portion which is upwardly recessed from a center of lower surface portion; and
            a second recess portion which is further upwardly recessed from a top surface of the first recess portion;
        a side surface portion extending upwardly from an edge of the lower surface portion;
        an upper surface portion formed at an upper end of the side surface portion and configured to allow light emitted from the light source to be reflected towards the side surface portion and refracted towards the display panel,
    wherein a height of an edge of the upper surface portion from the lower surface portion is greater than a height of a center of the upper surface portion from the lower surface portion,
    wherein the side surface portion is outwardly inclined from the lower surface portion to the upper surface portion,
    wherein a longitudinal section between the edge and the center of the upper surface portion has a convexly curved shape.

2. The display unit of claim 1, wherein the upper surface portion is curved such that an amount of the reflected light from the upper surface portion is bigger than an amount of the refracted light from the upper surface portion.

3. The display unit of claim 1, wherein a width of the top surface of the first recess portion is bigger than a width of a bottom surface of the second recess portion.

4. The display unit of claim 3, wherein the top surface of the first recess portion is flat and the second recess portion has an aspheric shape.

5. The display unit of claim 1, wherein an inclination angle of the side portion of the lens is equal to or less than 45 degrees from the horizontal surface.

6. The display unit of claim 1, wherein H/P is configured to be more than 0.3,
H: depth of the upper surface portion,
P: pitch of the upper surface portion.

7. The display unit of claim 1, further comprising a diffusion layer disposed beneath the lower surface of the lens.

8. A lens disposed above a light emitting device, comprising:
a lower surface portion;
a light source receiving portion recessed upwardly from the lower surface portion, the light source receiving portion including:
a first recess portion which is upwardly recessed from a center of lower surface portion; and
a second recess portion which is further upwardly recessed from a top surface of the first recess portion;
a side surface portion extending upwardly from an edge of the lower surface portion;
an upper surface portion formed at an upper end of the side surface portion and configured to allow light emitted from the light source to be reflected towards the side surface portion and refracted towards a display panel,
wherein a height of an edge of the upper surface portion from the lower surface portion is greater than a height of a center of the upper surface portion from the lower surface portion,
wherein the side surface portion is outwardly inclined from the lower surface portion to the upper surface portion,
wherein a longitudinal section between the edge and the center of the upper surface portion has a convexly curved shape.

9. The display unit of claim 8, wherein the upper surface portion is curved such that an amount of the reflected light from the upper surface portion is bigger than an amount of the refracted light from the upper surface portion.

10. The display unit of claim 8, wherein a width of the top surface of the first recess portion is bigger than a width of a bottom surface of the second recess portion.

11. The display unit of claim 10, wherein the top surface of the first recess portion is flat and the second recess portion has an aspheric shape.

12. The display unit of claim 8, wherein an inclination angle of the side portion of the lens is equal to or less than 45 degrees from the horizontal surface.

13. The display unit of claim 8, wherein H/P is configured to be more than 0.3,
H: depth of the upper surface portion,
P: pitch of the upper surface portion.

14. The display unit of claim 8, further comprising a diffusion layer disposed beneath the lower surface of the lens.

* * * * *